(12) United States Patent
Park

(10) Patent No.: US 7,843,759 B2
(45) Date of Patent: Nov. 30, 2010

(54) SEMICONDUCTOR MEMORY DEVICE HAVING REDUCED CURRENT CONSUMPTION DURING DATA MASK FUNCTION

(75) Inventor: Ki Chon Park, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 126 days.

(21) Appl. No.: 12/206,824

(22) Filed: Sep. 9, 2008

(65) Prior Publication Data

US 2009/0207676 A1    Aug. 20, 2009

(30) Foreign Application Priority Data

Feb. 14, 2008    (KR) ...................... 10-2008-0013680

(51) Int. Cl.
*G11C 8/00* (2006.01)
(52) U.S. Cl. ............................ 365/230.06; 365/230.03; 365/189.16; 365/230.08
(58) Field of Classification Search ............ 365/230.06, 365/230.03, 189.16, 230.08, 189.05, 191

See application file for complete search history.

(56) References Cited

U.S. PATENT DOCUMENTS

| 6,351,423 B2 * | 2/2002 | Ooishi ........................ 365/207 |
| 6,404,695 B1 * | 6/2002 | Fujino et al. ........... 365/230.03 |

FOREIGN PATENT DOCUMENTS

| JP | 05-325545 A | 12/1993 |
| JP | 07-013509 A | 1/1995 |

* cited by examiner

*Primary Examiner*—David Lam
(74) *Attorney, Agent, or Firm*—Ladas & Parry LLP

(57) ABSTRACT

The present invention describes a semiconductor memory device having a data mask function and includes a common driving control unit for generating a common driving control signal in response to a data mask signal and a write command signal supplied to the common driving control unit. A plurality of driving units are supplied with the common driving control signal and selectively drive data according to the common driving control signal and transmit the driven data to a plurality of data lines, respectively. Accordingly, a driving and data mask operation of the plurality of driving units is controlled by the common driving control unit, which reduces current consumption and a layout area of the circuit.

20 Claims, 9 Drawing Sheets

FIG.3A

| BA0 | BA1 |
|---|---|
| I00~I015 | I016~I031 |
| BA2 | BA3 |
| I032~I047 | I048~I063 |

| Q0 | Q1 | Q2 | Q3 |
|---|---|---|---|
| I00~I015 | I00~I015 | I00~I015 | I00~I015 |

| BA0<br>I00~I015 | BA1<br>I016~I031 |
|---|---|
| BA2<br>I032~I047 | BA3<br>I048~I063 |

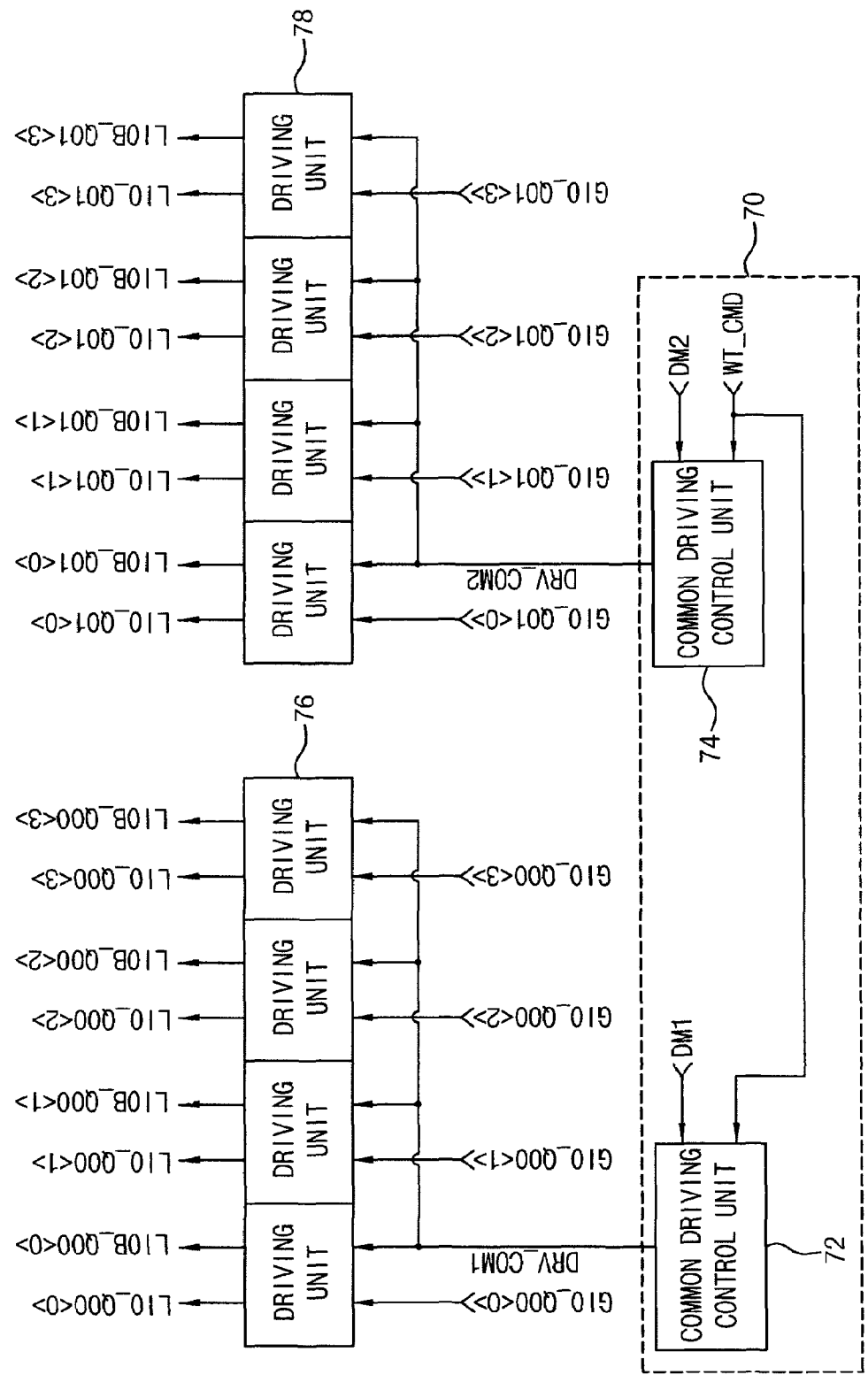

SEMICONDUCTOR MEMORY DEVICE HAVING REDUCED CURRENT CONSUMPTION DURING DATA MASK FUNCTION

CROSS-REFERENCE TO RELATED APPLICATIONS

The present application claims priority to Korean patent application number 10-2008-0013680 filed on Feb. 14, 2008, which is incorporated herein by reference in its entirety.

BACKGROUND OF THE INVENTION

The present invention relates to a semiconductor memory device, and more particularly to a semiconductor memory device having a data mask function.

The data mask function of a semiconductor memory device is used when it is desirable to prevent input data from being written to a memory cell. The data is generally masked in an 8-bit unit. In other words, one mask pin is provided for 8 data input/output pins (DQ).

Accordingly, two data mask signals are used for a semiconductor memory device having an 'x16' structure and four data mask signals are used for a semiconductor memory device having an 'x32' structure. Furthermore, a single data mask signal is used for a semiconductor memory device having 'x8' and 'x4' structures.

In a semiconductor memory device according to the prior art, a write driver is arranged for each data line. Therefore, as illustrated in FIG. 1, eight write drivers 10 are arranged with each corresponding to one of eight global data lines GIO<0:7>, and the eight write drivers 10 share one data mask signal DM.

In addition, the write drivers 10 transmit data of the global data lines GIO<0:7> to respective local data lines LIO<0:7> and LIOB<0:7> according to a write command signal WT_CMD. When a data mask signal DM is in an enable state, the data is masked and not transmitted to local data lines LIO<0:7> and LIOB<0:7>.

As illustrated in FIG. 2, a representative configuration of a write driver 10 connected to a global data line GIO<0> may include a driving control unit 20 and a driving unit 22.

The write driver 10 operates such that if the data mask signal DM is in a disable state when a write command signal WT_CMD is inputted to a driving control unit 20, a driving control signal DRV is enabled. Accordingly, a data of a global data line (for instance GIO<0>) is transmitted to a local data line LIO<0> and LIOB<0> via a driving unit 22.

On the other hand, if the data mask signal DM is in an enable state, a driving control signal DRV is disabled via a driving control unit 20. Accordingly, a data of a global data line (for instance GIO<0>) is masked and not transmitted to a local data line LIO<0> and LIOB<0> through a driving unit 22.

In the semiconductor memory device according to the prior art as described above, the write driver 10 having the configuration as illustrated in FIG. 2 is arranged for each data line to control a data transmission or mask for each data line.

However, as semiconductor memory devices process larger amounts of data at faster speeds, the number of data lines may increase. According to the prior art, a write driver is arranged for each data line. Therefore, the number of write drivers increases according to the increased number of data lines.

Such an increased number of write drivers causes a problem in that increased current consumption may occur due to a data mask operation of the write drivers. Another problem may occur in that the area occupied by the write drivers in each bank is increased, thereby increasing the overall layout area of a semiconductor chip.

SUMMARY OF THE INVENTION

The present invention provides a semiconductor memory device in which current consumption of the semiconductor memory device due to a mask control operation is reduced.

The present invention also provides a semiconductor memory device in which the layout area occupied by a circuit, which controls a data mask, is reduced.

A semiconductor memory device according to an embodiment of the present invention includes a common driving control unit generating a common driving control signal in response to a data mask signal and a write command signal; and a plurality of driving units sharing the common driving control signal and selectively driving data by the common driving control signal and transmitting the driven data to a plurality of data lines, respectively.

Preferably, the common driving control unit controls a state of the common driving control signal according to a state of the data mask signal in a state that the write command signal is enabled.

Preferably, each of the driving unit drives the data when the common driving control signal is enabled and transmits the driven data to each of the data lines, and blocks a transmission of the data when the common driving control signal is disabled.

A semiconductor memory device according to another embodiment of the present invention includes a bank interfacing data with an outside through a plurality of data lines; a plurality of driving units respectively corresponding to the data interfaced through the data lines, and driving input data to transmit to each of the data lines; and a driving control circuit defining the plurality of driving units as one or more groups according to data mask information, and controlling a drive of the driving units for each of the groups by write information and the data mask information.

Preferably, the data mask information includes information about a number of data bits masked at once, and each of the driving unit groups controlled by the driving control circuit is comprised of a number of the driving units corresponding to the number of data bits masked at once.

Preferably, the driving control circuit includes one or more driving control units shared by each driving unit group, and each of the driving control units controls in common a drive of the driving units included in each of the driving unit groups.

Preferably, each of the driving control units generates a driving control signal controlling a drive for each of the driving unit groups in response to a write command signal corresponding to the write information and a data mask signal corresponding to the data mask information, and provides the generated driving control signal to each of the driving unit groups.

Preferably, each of the driving control units controls a state of the driving control signal according to a state of the data mask signal in a state that the write command signal is enabled.

Preferably, each of the driving unit groups determines whether or not the data is transmitted by selectively driving according to a state of the driving control signal.

Preferably, the bank is divided into a plurality of first bank areas sharing the data lines according to a burst length, and each of the first bank areas is divided into a plurality of second bank areas corresponding to each of the driving unit groups.

Preferably, the bank is divided into a plurality of first bank areas according to a classification of the data lines, and each of the first bank areas is divided into a plurality of second bank areas sharing the classified data lines according to a burst length, and each of the second bank areas corresponds to each of the driving unit groups.

A semiconductor memory device according to yet another embodiment of the present invention is includes a bank being divided into a plurality of first bank areas sharing data lines according to a burst length, and the input/output lines being classified into a plurality of groups, and each of the first bank areas being divided into a plurality of second bank areas corresponding to a plurality of the classified data line groups; a plurality of driving unit groups respectively being connected to data line groups corresponding to each of the second bank areas and driving input data and transmitting the driven input data to each of the data line groups; and a plurality of driving control units being shared one by one for each of the driving unit groups and controlling a drive by the driving unit groups in response to a write command signal and data mask signals.

Preferably, the data lines are classified into a plurality of groups corresponding to a number of data bits masked at once.

Preferably, each of the driving control units, in response to the write command signal and each of the data mask signals, generates a driving control signal controlling in common a drive for each of the driving unit groups and provides the driving control signal to each of the driving unit groups.

Preferably, each of the driving control units controls a state of the driving control signal according to a state of each of the data mask signals in a state that the write command signal is enabled.

Preferably, each of the driving unit groups determines whether or not the data is transmitted by selectively driving according to a state of the driving control signal.

A semiconductor memory device according to another embodiment of the present invention includes a bank being divided into a plurality of first bank areas corresponding to a classification of data lines, and each of the first bank areas being divided into a plurality of second bank areas sharing the classified data lines according to a burst length; a plurality of driving unit groups respectively being connected to the classified data lines corresponding to each of the second bank areas and driving input data and transmitting the driven data to the classified data lines respectively; and a plurality of driving control units being shared one by one for each of the driving unit groups and controlling a drive by the driving unit groups in response to a write command signal and data mask signals.

Preferably, the data lines are classified by corresponding to a number of data bits masked at once.

Preferably, each of the driving control units, in response to the write command signal and each of the data mask signals, generates a driving control signal controlling in common a drive for each of the driving unit groups and provides the driving control signal to each of the driving unit groups.

Preferably, each of the driving control units controls a state of the driving control signal according to a state of each of the data mask signals in a state that the write command signal is enabled.

Preferably, each of the driving unit groups determines whether or not the data is transmitted by selectively driving according to a state of the driving control signal.

BRIEF DESCRIPTION OF THE DRAWINGS

FIGS. 3A through 3C are block diagrams showing an embodiment of bank area divisions according to a data line arrangement in a semiconductor memory device according to the present invention.

FIG. 7 is a block diagram showing a data driving and mask control related circuit arranged in bank areas Q00 and Q01 in FIG. 6C.

DESCRIPTION OF SPECIFIC EMBODIMENTS

Hereinafter, preferred embodiments of the present invention will be described in detail with reference to the accompanying drawings.

According to the present invention, a semiconductor memory device is disclosed in which a driving and data masking operation in a plurality of driving units is commonly controlled through a driving control unit, thereby reducing current consumption and layout area due to the driving units and the driving control units.

Figure 1:
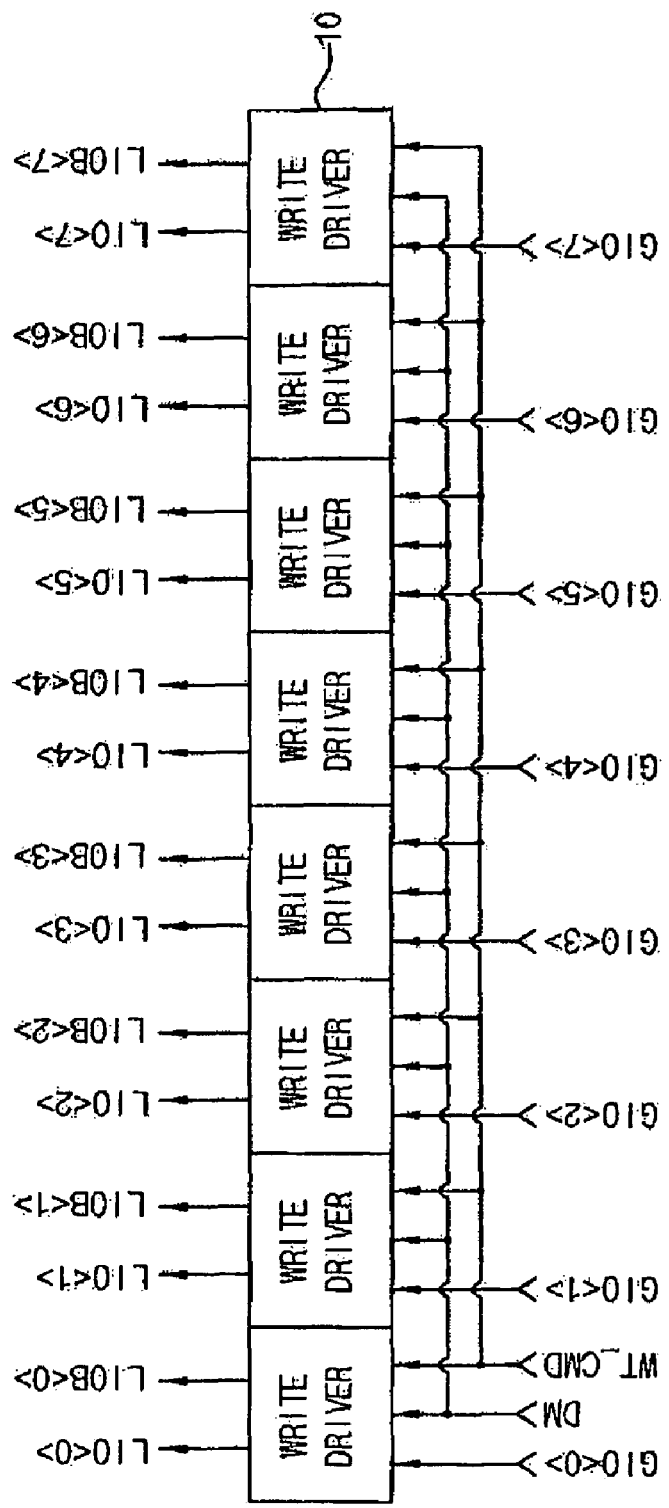
FIG. 1 is a block diagram illustrating an arrangement of write drivers in a semiconductor memory device according to the prior art.
Figure 2:
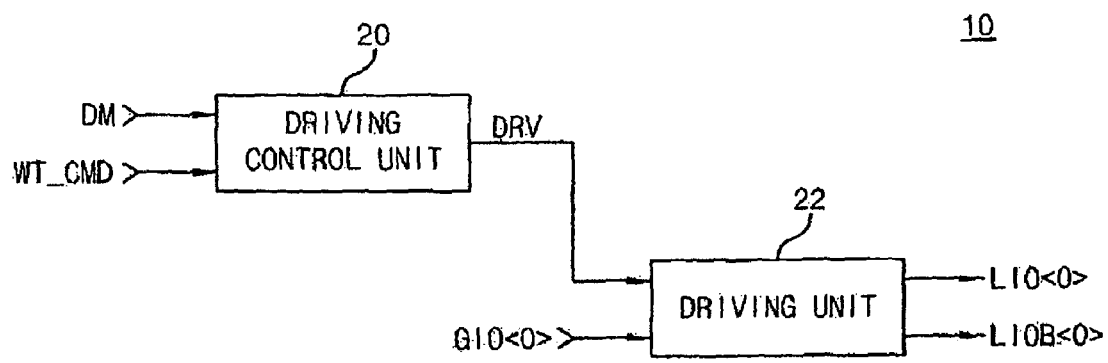
FIG. 2 is a block diagram showing a detailed configuration for any one of the write drivers 10 in FIG. 1.
Figure 3C:
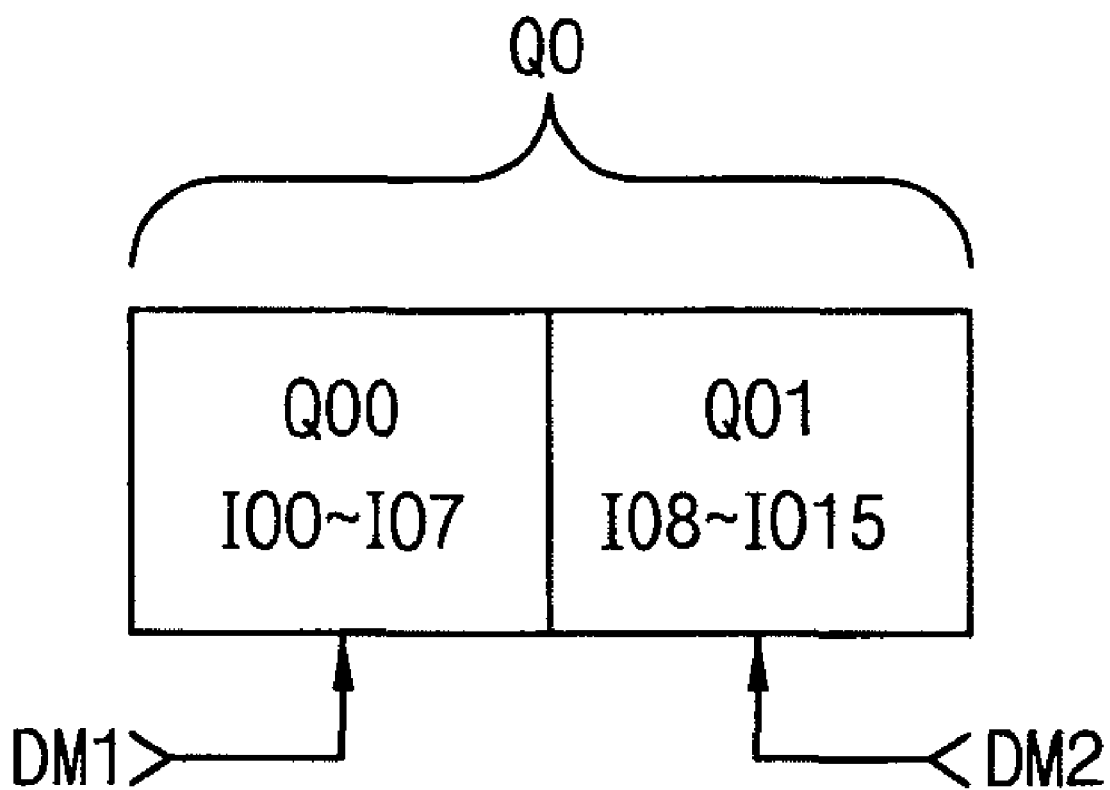

Specifically, in a semiconductor memory device according to an embodiment of the present invention, a four-bank BA0-BA3 structure having 16 data input/output pins may by disclosed as illustrated in FIGS. 3A through 3C.

In the above-described structure, where a 4-bit prepatch method is implemented, 64 data lines IO0-IO63 are provided as illustrated in FIG. 3A. Additionally, 16 data lines IO0-IO15 may be arranged for each bank (for instance, BA0).

As illustrated in FIG. 3B, where a burst length is 4, each bank (for instance, BA0) may be divided into 4 bank areas Q0-Q3. Herein, assuming that first data of the burst length are stored in bank area Q0 and fourth data of the burst length are stored in bank area Q3, the first data are inputted to 16 data input/output pins and are respectively stored in the bank area Q0 through 16 data lines IO0-IO15.

In addition, as illustrated in FIG. 3C, the bank area (for instance, Q0) may be divided into a bank area Q00 for storing data inputted through 8 data lines IO0-IO7 and a bank area Q01 for storing data inputted through 8 data lines IO8-IO15.

At this time, a data mask typically controls an 8-bit data unit. Therefore, data inputted through 8 data lines IO0-IO7 are controlled via data mask signal DM1 and data inputted through 8 data lines IO8-IO15 are controlled via data mask signal DM2.

A data mask control for the 8 data lines IO0-IO7 in the bank area Q00 may be implemented using a plurality of driving units (not shown) corresponding to each of the data lines IO0-IO7 and a common driving control unit (not shown) inputted with a data mask signal DM1. Similarly, a data mask control for the 8 data lines IO8-IO15 in the bank area Q01 may be implemented using a plurality of driving units (not shown) corresponding to each of the data lines IO8-IO15 and a common driving control unit (not shown) inputted with a data mask signal DM2.

Figure 4:
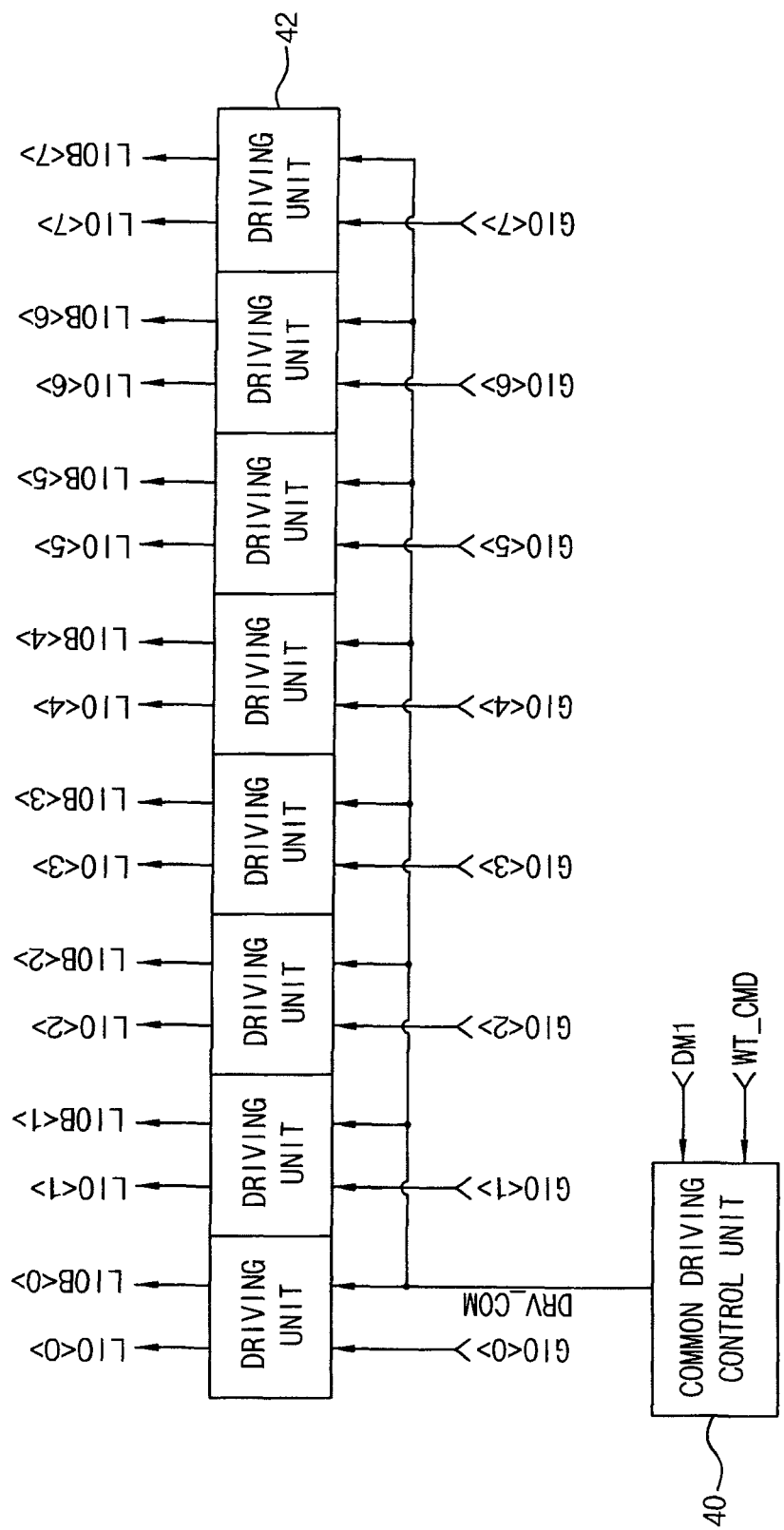
FIG. 4 is a block diagram showing a data driving and a mask control related circuit arranged in a bank area Q00 in FIG. 3C.

A data input and mask control structure of the bank area Q00 can be configured as a circuit as illustrated in FIG. 4. For reference, each of the data lines IO0-IO7 in FIGS. 3A through 3C corresponds to each of the global data lines GIO<0:7> as illustrated in FIG. 4, or corresponds to each of the global data lines GIO<0:7> and each of the local data lines LIO<0:7> and LIOB<0:7>.

Specifically, referring to FIG. 4, a semiconductor memory device according to an embodiment of the present invention may include a common driving control unit 40 and a plurality of driving units 42.

The common driving control unit 40 receives a data mask signal DM1 and a write command signal WT_CMD to generate a common driving control signal DRV_COM.

Herein, the common driving control unit 40 enables the outputted common driving control signal DRV_COM when the write command signal WT_CMD is enabled, and disables the outputted common driving control signal DRV_COM when the data mask signal DM1 is enabled when the write command signal WT_CMD is enabled.

A plurality of driving units 42 share the common driving control signal DRV_COM. The common driving control signal DRV_COM selectively drives data of global data lines GIO<0:7> to be respectively transmitted to local data lines LIO<0:7> and LIOB<0:7>.

Herein, each of the driving units 42 drives data of a global data line, for instance GIO<0>, to transmit the data to a local data line LIO<0> and LIOB<0> when the common driving control signal DRV_COM is enabled. On the other hand, each of the driving units 42 does not drive data of a global data line, for instance GIO<0>, when the common driving control signal DRV_COM is disabled. Thus, data of the global data line GIO<0> is masked and not transmitted to a local date data line LIO<0> and LIOB<0>.

Figure 5:
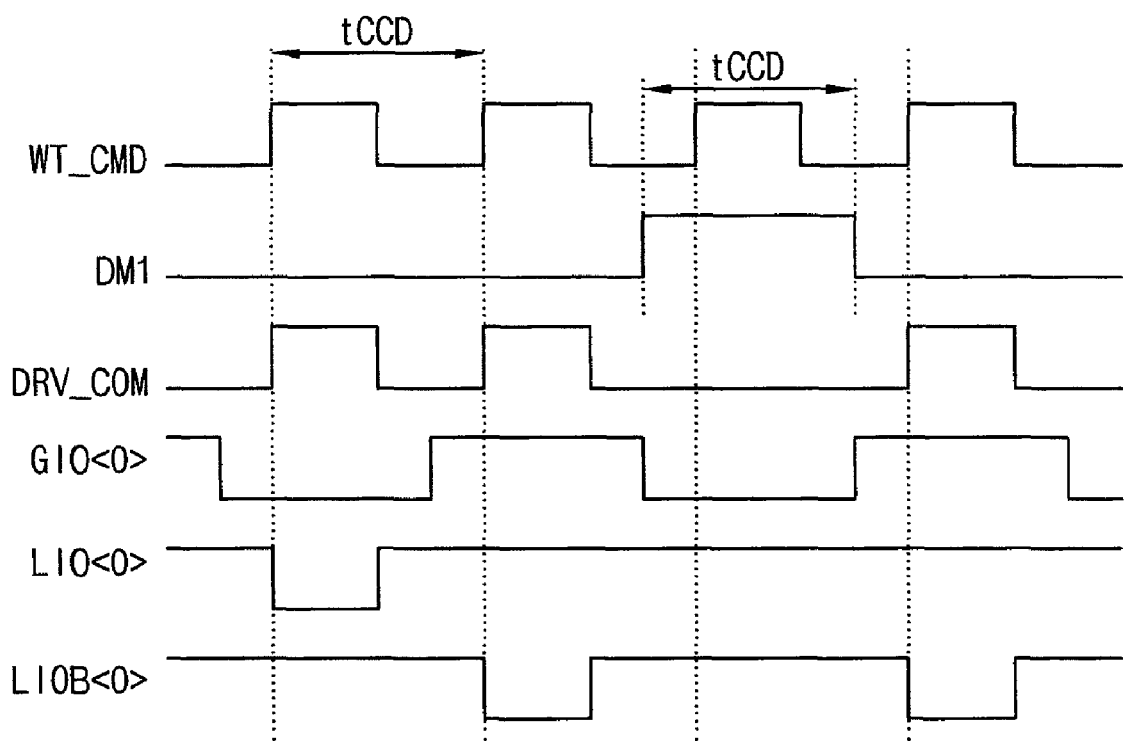
FIG. 5 is a waveform diagram illustrating a data mask control through a common driving control unit 40 and a driving unit 42 in FIG. 4.

Specifically, the operations of such a common driving control unit 40 and a plurality of driving units 42 are illustrated with reference to FIG. 5. If the write command signal WT_CMD is enabled when the data mask signal DM1 is in a disabled state for a CAS command delay time 'tCCD' (CAS to CAS command time), then the common driving control signal DRV_COM is enabled.

At this time, if low-level data is inputted to a global data line GIO<0>, then low-level data is loaded to a local data line LIO<0> and a local data line bar LIOB<0> becomes high level.

Furthermore, the common driving control signal DRV_COM is enabled when the write command signal WT_CMD is enabled again after the 'tCCD'.

At this time, if high-level data is inputted to the global data line GIO<0>, then high-level data is loaded to the local data line LIO<0> and the local data line bar LIOB<0> becomes low level.

If the write command signal WT_CMD is enabled when the data mask signal DM1 is enabled by a CAS command and maintains a high level for the 'tCCD', then the common driving control signal DRV_COM is disabled.

At this time, even when low level data is inputted to the global data line GIO<0>, the low level data is not loaded to the local data line LIO<0>, but rather maintains its prior state, i.e., a high level. The local data line bar LIOB<0> also maintains its prior state, i.e., a high level. In other words, a driving unit 42 masks the data of the global data line GIO<0>.

As described above, in a semiconductor memory device according to an embodiment of the present invention, a bank (for instance BA0) is divided into bank areas Q0-Q3 sharing a plurality of data lines IO0-IO15 according to a burst length. Each bank area (for instance Q0) has a structure that is divided into a bank area Q00 corresponding to data lines IO0-IO7 and a bank area Q01 corresponding to data lines IO8-IO15.

Furthermore, driving units 42 respectively drive the data of data lines IO0-IO7 in each bank area (for instance Q0). The driving units 42 are commonly controlled by a common driving control unit 40.

In other words, the driving units 42 are arranged corresponding to the data transmitted to data lines IO0-IO15 in each bank (for instance BA0). A common driving control unit 40 inputted with a data mask signal DM1 controls the driving units 42 to drive corresponding data lines IO0-IO7 and a common driving control unit (not shown) inputted with a data mask signal DM2 controls the driving units (not shown) to drive corresponding data lines IO8-IO15.

Figures 6A, 6B:
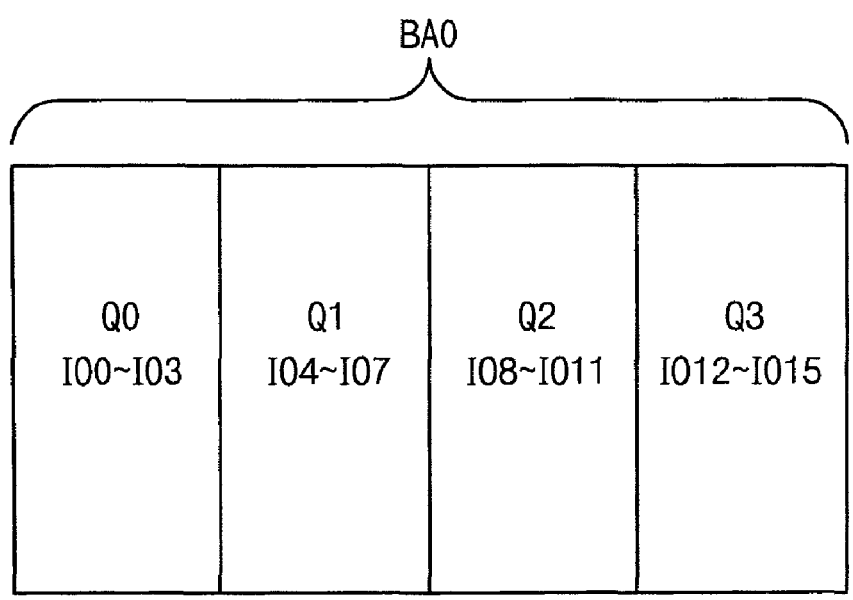
FIGS. 6A through 6C are block diagrams showing another embodiment of bank area divisions according to a data line arrangement in a semiconductor memory device according to the present invention.
Figure 6C:
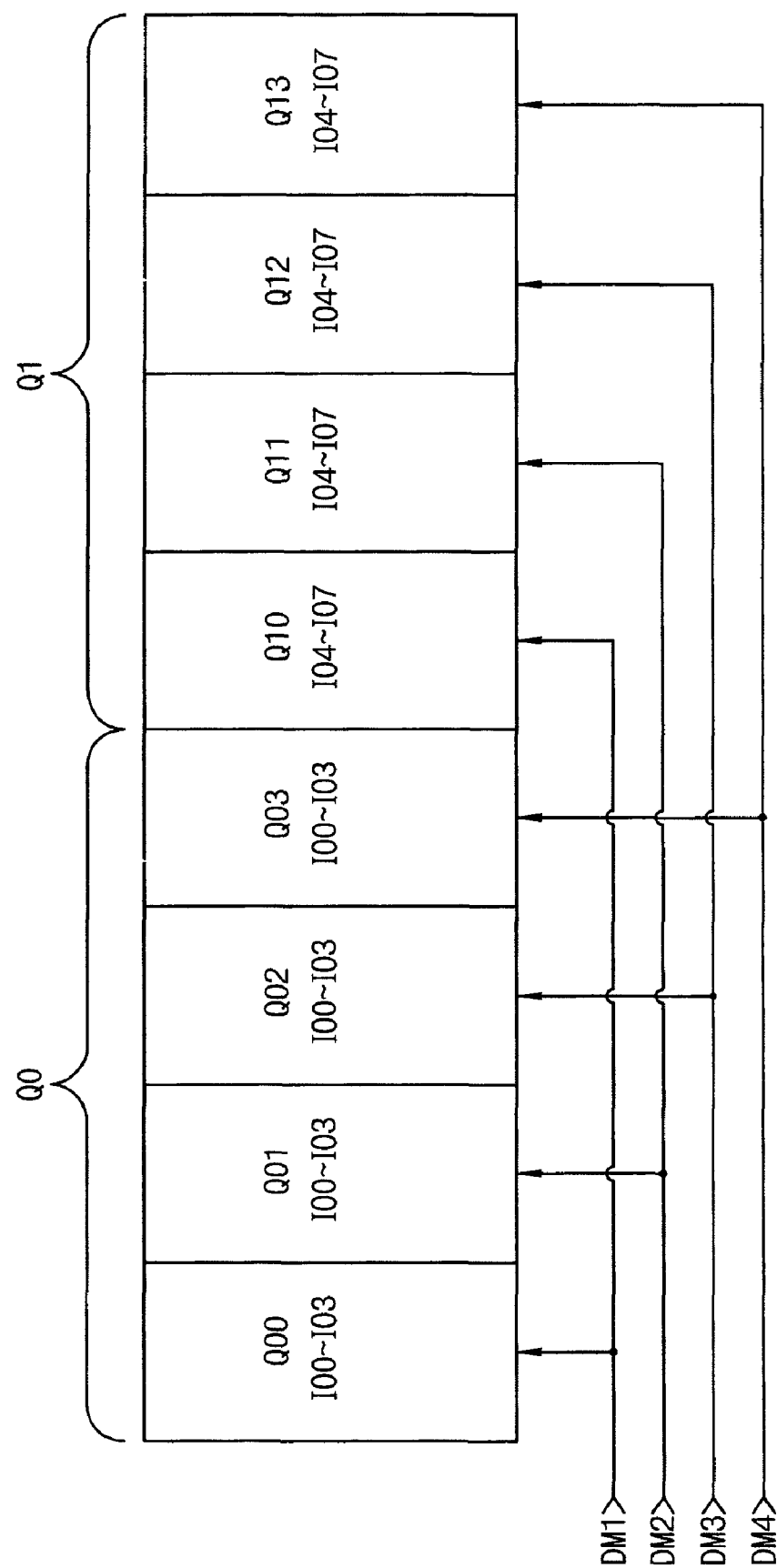

A semiconductor memory device according to another embodiment of the present invention is illustrated in FIGS. 6A through 6C and may include a four-bank (BA0-BA3) structure having 16 data input/output pins.

Similar to the previously disclosed embodiment, when using a 4-bit prepatch method, 64 data lines IO0-IO63 are provided as illustrated in FIG. 6A. Each bank (for instance BA0) may be arranged to have 16 data lines IO0-IO15.

As illustrated in FIG. 6B, each bank (for instance BA0) can be divided into 4 bank areas Q0-Q3 on the basis of data input/output pins. Herein, data lines IO0-IO15 may be grouped according to bits that are masked together. In other words, where 4-bit data are masked together, data lines IO0-IO15 in a bank (for instance BA0) may be divided and arranged into 4 portions, such as IO0-IO3, IO4-IO7, IO8-IO11 and IO12-IO15. The bank BA0 may be divided into 4 bank areas Q0-Q3 corresponding to the divided portions of the data lines IO0-IO15.

As illustrated in FIG. 6C, where a burst length is 4, each bank (for instance Q0 and Q1) may be respectively divided into 4 bank areas Q00-Q03 sharing 4 data lines IO0-IO3 and 4 bank areas Q10-Q13 sharing 4 data lines IO4-IO7.

Herein, a data mask signal DM1 controls a mask for first data of the burst length stored in bank areas Q00 and Q10, a data mask signal DM2 controls a mask for second data of the burst length stored in bank areas Q01 and Q11, a data mask signal DM3 controls a mask for third data of the burst length stored in bank areas Q02 and Q12, and a data mask signal DM4 controls a mask for fourth data of the burst length stored in bank areas Q03 and Q13.

A mask control for the data of the 4 data lines IO0-IO3 in a bank area Q00 may include a plurality of driving units (not shown) corresponding to data lines IO0-IO3 and a common driving control unit (not shown) inputted with a data mask signal DM1. Similarly, a mask control for the data of the 4 data lines IO0-IO3 in the remaining bank areas Q01-Q03 may include a plurality of driving units (not shown) respectively corresponding to data lines IO0-IO3 and a common driving control unit (not shown) inputted with data mask signals DM2-DM4, respectively.

A data mask control structure of the bank areas Q00 and Q01 can be configured as a circuit as illustrated in FIG. 7. As reference, data lines IO0-IO3 for each of the bank areas Q00 and Q01 as illustrated in FIGS. 6A through 6C correspond to each of the global data lines GIO_Q00<0:3> and GIO_Q01<0:3> as illustrated in FIG. 7, or correspond to each of the global data lines GIO_Q00<0:3> and GIO_Q01<0:3> and each of the local data lines 'LIO_Q00<0:3> and LIOB_Q00<0:3>' and 'LIO_Q01<0:3> and LIOB_Q01<0:3>'. The dividing of the global data lines into GIO_Q00<0:3> and GIO_Q01<0:3> is to divide data input according to a burst order. Each of the global data lines 'GIO_Q00<0> and GIO_Q01<0>', 'GIO_Q00<1> and GIO_Q01<1>', 'GIO_Q00<2> and GIO_Q01<2>', and 'GIO_Q00<3> and GIO_Q01<3>' is substantially the same line. Similarly, this applies to local data lines 'LIO_Q00<0:3> and LIOB_Q00<0:3>' and 'LIO_Q01<0:3> and LIOB_Q01<0:3>'.

Specifically, referring to FIG. 7, a semiconductor memory device according to the above embodiment of the present invention may include a driving control unit 70 and a plurality of driving units 76 and 78.

The driving control unit 70 may include a common driving control unit 72 for controlling a drive to four driving units 76 of a bank area Q00, and a common driving control unit 74 for controlling a drive to four driving units 78 of a bank area Q01.

The common driving control unit 72 generates a common driving control signal DRV_COM1 by receiving a data mask signal DM1 and a write command signal WT_CMD.

The common driving control unit 74 generates a common driving control signal DRV_COM2 by receiving a data mask signal DM2 and a write command signal WT_CMD.

Common driving control units 72 and 74 enable the outputted common driving control signals DRV_COM1 and DRV_COM2 respectively, when the write command signal WT_CMD is enabled, and disable the outputted common driving control signals DRV_COM1 and DRV_COM2 when the data mask signals DM1 and DM2 respectively, are enabled when the write command signal WT_CMD is enabled.

A plurality of driving units 76 share the common driving control signal DRV_COM1. The common driving control signal DRV_COM1 selectively drives data of global data lines GIO_Q00<0:3> to be transmitted to local data lines LIO_Q00<0:3> and LIOB_Q00<0:3>.

Herein, each of the driving units 76 drives data of a global data line, for instance GIO_Q00<0>, to transmit the data to a local data line LIO_Q00<0> and LIOB_Q00<0> when the common driving control signal DRV_COM1 is enabled. On the other hand, each of the driving units 76 does not drive data of a global data line, for instance GIO_Q00<0>, when the common driving control signal DRV_COM1 is disabled. Thus, the data of the global data line GIO_Q00<0> is masked and not transmitted to a local data line LIO_Q00<0> and LIOB_Q00<0>.

A plurality of driving units 78 share the common driving control signal DRV_COM2. The common driving control signal selectively drives data of global data lines GIO_Q01<0:3> to be transmitted to local data lines LIO_Q01<0:3> and LIOB_Q01<0:3>.

Herein, each of the driving units 78 drives data of a global data line, for instance GIO_Q01<0>, to transmit the data to a local data line LIO_Q01<0> and LIOB_Q01<0> when the common driving control signal DRV_COM2 is enabled. On the other hand, each of the driving units 78 does not drive data of a global data line, for instance GIO_Q01<0>, when the common driving control signal DRV_COM2 is disabled. Thus, the data of the global data line GIO_Q01<0> is masked and not transmitted to a local data line LIO_Q01<0> and LIOB_Q01<0>.

As described above, in a semiconductor memory device according to the above-described embodiment of the present invention, a bank (for instance BA0) is divided into a plurality of bank areas Q0-Q3 according to a division of data lines. Each bank area (for instance Q0) has a structure that is divided into bank areas Q00-Q03 sharing a plurality of data lines IO0-IO3 according to a burst length.

Furthermore, driving units 76 respectively drive the data of data lines IO0-IO3 in each bank area (for instance Q00). The driving units 76 are commonly controlled by a common driving control unit 72.

In other words, the driving units 76 are arranged corresponding to the data transmitted to data lines IO0-IO15 in each bank (for instance BA0). A common driving control unit 72 inputted with a data mask signal DM1 controls the driving units 76 corresponding to first data of a burst length of the above-mentioned data and a common driving control unit 74 inputted with a data mask signal DM2 controls the driving units 78 corresponding to second data of a burst length of the above-mentioned data.

As described above, a semiconductor memory device according to the present invention includes a plurality of driving units for driving data. The plurality of driving units control a driving and data mask operation via a common driving control unit. Such a configuration may be applied when the data lines are arranged as described in either embodiment of the present invention.

Accordingly, the number of driving control units is reduced as compared to the prior art where a driving control unit is arranged for each driving unit. Accordingly, the reduction of driving control units remarkably reduces current consumption due to a data mask operation.

Moreover, as the number of driving control units is reduced, a layout area for a circuit controlling a data mask operation is reduced. Accordingly, the reduced layout area allows an overall area of a semiconductor memory chip to be reduced.

According to the present invention, there is provided a semiconductor memory device including driving units that drive data and are divided into groups corresponding to data lines. The semiconductor memory device commonly controls a driving and data mask operation for each of the driving unit groups to reduce current consumption due to a mask control operation.

Moreover, according to the present invention, there is provided a semiconductor memory device where a driving control unit is shared by a plurality of driving units to commonly control a driving and data mask operation of the driving units. Thus, the number of driving control units is reduced, thereby reducing a layout area of a data mask related circuit.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device, comprising:
    a common driving control unit generating a common driving control signal according to a data mask signal and a write command signal; and
    a plurality of driving units receiving the common driving control signal and selectively driving data supplied to the plurality of driving units according to the common driving control signal and transmitting the driven data to a plurality of data lines, respectively.

2. The semiconductor memory device as set forth in claim 1, wherein the common driving control unit controls a state of the common driving control signal according to a state of the data mask signal when the write command signal is enabled.

3. The semiconductor memory device as set forth in claim 1, wherein each of the driving units drives the data and transmits the driven data to each of the data lines when the common driving control signal is enabled, and blocks a transmission of the data to each of the data lines when the common driving control signal is disabled.

4. A semiconductor memory device, comprising:
a cell array coupled to a plurality of data lines;
a first driving control unit configured to generate a first driving control signal in response to a write information and a first data mask information;
a second driving control unit configured to generate a second driving control signal in response to the write information and a second data mask information;
a first driving unit configured to drive an input data to the data lines according to the first driving control signal; and
a second driving unit driving the input data to the data lines according to the second driving control signal.

5. The semiconductor memory device of claim 4, wherein the first data mask information includes information for the number of the data lines that are masked together by a first masking operation, and
the first driving unit includes first drivers the number of which corresponds to the number of data lines masked together by the first masking operation.

6. The semiconductor memory device of claim 5, wherein the second data mask information includes information for the number of the data lines that are masked together by a second masking operation, and
the second driving unit includes second drivers the number of which corresponds to the number of data lines masked together by the second masking operation.

7. The semiconductor memory device of claim 6, wherein the first drivers are shared by the first driving control unit.

8. The semiconductor memory device of claim 7, wherein the second drivers are shared by the second driving control unit.

9. The semiconductor memory device of claim 8, wherein the first driving control unit controls a state of the first driving control signal according to a state of a first data mask signal, which corresponds to the first data mask information, when a write command signal, which corresponds to the write information, is enabled, and provides the controlled first driving control signal to the first drivers.

10. The semiconductor memory device of claim 9, wherein the second driving control unit controls a state of the second driving control signal according to a state of a second data mask signal, which corresponds to the second data mask information, when the write command signal is enabled, and provides the controlled second driving control signal to the second drivers.

11. A semiconductor memory device, comprising:
a bank divided into a plurality of first bank areas sharing data lines, the data lines being classified into a plurality of groups, and each of the first bank areas being further divided into a plurality of second bank areas corresponding to a plurality of the classified data line groups;
a plurality of driving unit groups respectively connected to data line groups corresponding to each of the second bank areas and driving input data to transmit the driven input data to each of the data line groups; and
a plurality of driving control units each of which generates a plurality of driving control signals corresponding to the plurality of driving unit groups by combining a write command signal and a data mask signal, and controls the plurality of the driving unit groups by using the plurality of the driving control signals.

12. The semiconductor memory device as set forth in claim 11, wherein the data lines are classified into a plurality of groups corresponding to a number of data bits that are masked together.

13. The semiconductor memory device as set forth in claim 11, wherein each of the driving control units generates a driving control signal commonly controlling a drive for each of the driving unit groups according to the write command signal and each of the data mask signals, and provides the generated driving control signal to each of the driving unit groups.

14. The semiconductor memory device as set forth in claim 13, wherein each of the driving control units controls a state of the driving control signal according to a state of each of the data mask signals when the write command signal is enabled.

15. The semiconductor memory device as set forth in claim 14, wherein each of the driving unit groups determines whether the data is transmitted by selectively driving the data according to the state of the driving control signal.

16. A semiconductor memory device, comprising:
a bank divided into a plurality of first bank areas corresponding to a classification of data lines, each of the first bank areas being further divided into a plurality of second bank areas sharing the classified data lines;
a plurality of driving unit groups respectively connected to the classified data lines corresponding to each of the second bank areas and driving input data to transmit the driven data to the classified data lines respectively; and
a plurality of driving control units each of which generates a plurality of driving control signals corresponding to the plurality of driving unit groups by combining a write command signal and a data mask signal, and controls the plurality of the driving unit groups by using the plurality of the driving control signals.

17. The semiconductor memory device as set forth in claim 16, wherein the data lines are classified corresponding to a number of data bits that are masked together.

18. The semiconductor memory device as set forth in claim 16, wherein each of the driving control units generates a driving control signal commonly controlling a drive for each of the driving unit groups according to the write command signal and each of the data mask signals, and provides the generated driving control signal to each of the driving unit groups.

19. The semiconductor memory device as set forth in claim 18, wherein each of the driving control units controls a state of the driving control signal according to a state of each of the data mask signals when the write command signal is enabled.

20. The semiconductor memory device as set forth in claim 19, wherein each of the driving unit groups determines whether the data is transmitted by selectively driving the data according to the state of the driving control signal.

* * * * *